US009541424B2

United States Patent

Friedrich et al.

(10) Patent No.: US 9,541,424 B2
(45) Date of Patent: *Jan. 10, 2017

(54) CIRCUITS AND METHODS FOR PROCESSING SIGNALS GENERATED BY A CIRCULAR VERTICAL HALL (CVH) SENSING ELEMENT IN THE PRESENCE OF A MULTI-POLE MAGNET

(71) Applicant: Allegro MicroSystems, LLC, Worcester, MA (US)

(72) Inventors: Andreas P. Friedrich, Metz-Tessy (FR); Andrea Foletto, Annecy (FR)

(73) Assignee: Allegro MicroSystems, LLC, Worcester, MA (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/186,433

(22) Filed: Jun. 18, 2016

(65) Prior Publication Data

US 2016/0290830 A1 Oct. 6, 2016

Related U.S. Application Data

(63) Continuation of application No. 13/724,080, filed on Dec. 21, 2012.

(51) Int. Cl.
*G01R 33/07* (2006.01)
*G01D 5/14* (2006.01)

(52) U.S. Cl.
CPC .................................. *G01D 5/145* (2013.01)

(58) Field of Classification Search
CPC ....... G01R 33/07; G01R 33/02; G01R 33/072; G01R 33/093; G01R 33/096; G01R 15/202; H01L 51/0072; H01L 51/5056; H01L 51/0067; G01D 5/14; G01D 5/12
(Continued)

(56) References Cited

U.S. PATENT DOCUMENTS 4,668,914 A 5/1987 Kersten et al.
4,761,569 A 8/1988 Higgs
(Continued)

FOREIGN PATENT DOCUMENTS

DE 10 2005 014 509 B4 10/2006
DE 10 2006 037 226 A1 2/2008
(Continued)

OTHER PUBLICATIONS

PCT Invitation to Pay Additional Fees with Partial Search Report of the ISA dated Mar. 24, 2014; for PCT Pat. App. No. PCT/US2013/017619; 7 pages.
(Continued)

*Primary Examiner* — Jermele M Hollington
*Assistant Examiner* — Taqi Nasir
(74) *Attorney, Agent, or Firm* — Daly, Crowley, Mofford and Durkee, LLP (57) ABSTRACT

Described embodiments provide a magnetic field sensor has a circular vertical Hall (CVH) sensing element with a plurality of vertical Hall elements disposed over a common implant region in a substrate. The magnetic field sensor generates output signals responsive to a magnetic field generated by a multi-pole magnet having a plurality of north poles and also a plurality of south poles. An angle sensor generates an angle signal representative of an angle of a direction component of the magnetic field. A pole pair counter generates a count signal representative of a count of a number of the pole pairs of the multi-pole magnet that move past the CVH sensing element. An angle interpolation module generates a reconstructed angle signal representative of an angular position of the multi-pole magnet relative to the CVH sensing element based upon the count signal and the angle signal. Corresponding methods are also described.

18 Claims, 5 Drawing Sheets

(58) Field of Classification Search
USPC .......................... 324/251, 244, 76.77, 207.2,
207.21,324/207.22, 207.23,
207.24–207.26, 200–206,324/301, 248,
249, 250, 253, 256, 258
See application file for complete search history.

(56) References Cited

U.S. PATENT DOCUMENTS

| | | | |
|---|---|---|---|
| 4,814,673 A * | 3/1989 | Nguyen | G11B 15/54 318/7 |
| 4,829,352 A | 5/1989 | Popovic et al. | |
| 5,541,506 A | 7/1996 | Kawakita et al. | |
| 5,572,058 A | 11/1996 | Biard | |
| 5,612,618 A | 3/1997 | Arakawa | |
| 5,619,137 A | 4/1997 | Vig et al. | |
| 5,621,319 A | 4/1997 | Bilotti et al. | |
| 5,657,189 A | 8/1997 | Sandhu | |
| 5,694,038 A | 12/1997 | Moody et al. | |
| 5,757,180 A * | 5/1998 | Chou | G01D 5/145 324/207.2 |
| 5,831,513 A | 11/1998 | Lue | |
| 5,844,411 A | 12/1998 | Vogt | |
| 5,942,895 A | 8/1999 | Popovic et al. | |
| 6,064,199 A | 5/2000 | Walter et al. | |
| 6,064,202 A | 5/2000 | Steiner et al. | |
| 6,091,239 A | 7/2000 | Vig et al. | |
| 6,100,680 A | 8/2000 | Vig et al. | |
| 6,154,025 A | 11/2000 | Schelter et al. | |
| 6,166,535 A | 12/2000 | Irle et al. | |
| 6,232,768 B1 | 5/2001 | Moody et al. | |
| 6,236,199 B1 | 5/2001 | Irle et al. | |
| 6,265,864 B1 | 7/2001 | De Winter et al. | |
| 6,288,533 B1 | 9/2001 | Haeberli et al. | |
| 6,297,627 B1 | 10/2001 | Towne et al. | |
| 6,356,741 B1 | 3/2002 | Bilotti et al. | |
| 6,515,471 B1 | 2/2003 | Santos | |
| 6,525,531 B2 | 2/2003 | Forrest et al. | |
| 6,542,068 B1 | 4/2003 | Drapp et al. | |
| 6,545,462 B2 | 4/2003 | Schott et al. | |
| 6,622,012 B2 | 9/2003 | Bilotti et al. | |
| 6,768,301 B1 | 7/2004 | Hohe et al. | |
| 6,969,988 B2 | 11/2005 | Kakuta et al. | |
| 7,030,606 B2 | 4/2006 | Kato et al. | |
| 7,038,448 B2 | 5/2006 | Schott et al. | |
| 7,085,119 B2 | 8/2006 | Bilotti et al. | |
| 7,119,538 B2 | 10/2006 | Blossfeld | |
| 7,159,556 B2 | 1/2007 | Yoshihara | |
| 7,235,968 B2 | 6/2007 | Popovic et al. | |
| 7,259,556 B2 | 8/2007 | Popovic et al. | |
| 7,307,824 B2 | 12/2007 | Bilotti et al. | |
| 7,362,094 B2 | 4/2008 | Voisine et al. | |
| 7,495,432 B2 | 2/2009 | Kato et al. | |
| 7,714,570 B2 | 5/2010 | Thomas et al. | |
| 7,746,065 B2 | 6/2010 | Pastre et al. | |
| 7,759,929 B2 | 7/2010 | Forsyth | |
| 7,872,322 B2 | 1/2011 | Schott et al. | |
| 7,911,203 B2 | 3/2011 | Thomas et al. | |
| 7,965,076 B2 | 6/2011 | Schott | |
| 7,994,774 B2 | 8/2011 | Thomas et al. | |
| 2004/0130316 A1 | 7/2004 | Grueger et al. | |
| 2006/0011999 A1 | 1/2006 | Schott et al. | |
| 2008/0054886 A1 | 3/2008 | Uemura et al. | |
| 2009/0121707 A1 | 5/2009 | Schott | |
| 2009/0174395 A1 | 7/2009 | Thomas et al. | |
| 2010/0050731 A1 * | 3/2010 | Granig | G01D 5/145 73/1.11 |
| 2010/0156397 A1 | 6/2010 | Yabusaki et al. | |
| 2010/0164491 A1 * | 7/2010 | Kejik | G01R 33/077 324/251 |
| 2011/0025311 A1 | 2/2011 | Chauvin et al. | |
| 2011/0248708 A1 | 10/2011 | Thomas et al. | |
| 2012/0068694 A1 | 3/2012 | Mitamura et al. | |
| 2012/0217955 A1 * | 8/2012 | Petrie | G01D 5/145 324/207.2 |
| 2012/0262155 A1 | 10/2012 | Donovan et al. | |
| 2012/0299588 A1 * | 11/2012 | Petrie | G01R 33/077 324/251 |
| 2013/0265041 A1 | 10/2013 | Friedrich et al. | |

FOREIGN PATENT DOCUMENTS

| | | |
|---|---|---|
| DE | 10 2007 036 984 | 1/2009 |
| DE | 10 2007 036 984 A1 | 1/2009 |
| EP | 0 631 416 B1 | 12/1994 |
| EP | 0 875 733 B1 | 11/1998 |
| EP | 0 916 074 B1 | 5/1999 |
| EP | 2 000 814 A2 | 12/2008 |
| JP | 58-055668 A | 4/1983 |
| JP | 2003-042709 | 2/2003 |
| JP | 2005-241269 | 9/2005 |
| JP | 2010-014607 | 1/2010 |
| JP | 2010-078366 | 4/2010 |
| WO | WO 98/10302 | 3/1998 |
| WO | WO 98/54547 | 12/1998 |
| WO | WO 00/02266 | 1/2000 |
| WO | WO 03/036732 A2 | 5/2003 |
| WO | WO 2004/025742 A1 | 3/2004 |
| WO | WO 2006/056829 A1 | 6/2006 |
| WO | WO 2006/074989 A2 | 7/2006 |
| WO | WO 2008 145662 A1 | 12/2008 |
| WO | WO 2009/124969 A1 | 10/2009 |
| WO | WO 2012/161912 A2 | 11/2012 |
| WO | WO 2014/099280 A3 | 6/2014 |

OTHER PUBLICATIONS

PCT Search Report and Written Opinion of the ISA dated Mar. 27, 2014; for PCT Pat. App. No. PCT/US2013/073226; 12 pages.
PCT Search Report of the ISA for PCT/US2013/071619 dated Jul. 25, 2014 8 pages.
PCT Written Opinion of the ISA for PCT/US2013/071619 dated Jul. 25, 2014 13 pages.
PCT International Preliminary Report on Patentability and Written Opinion of the ISA dated Jul. 2, 2015; for PCT Pat. App. No. PCT/US2013/073226; 10 pages.
PCT International Preliminary Report on Patentability of the ISA dated Jul. 2, 2015; for PCT Pat. App. No. PCT/US2013/071619; 15 pages.
Office Action dated Jul. 3, 2015; for U.S. Appl. No. 13/724,149; 29 pages.
European Patent Office Communication Pursuant to Rules 161(1) and 162 EPC dated Jul. 24, 2015; For Pat. App. No. 13811286.7-1560; 2 pages.
Response dated Dec. 2, 2015 to Office Action dated Aug. 3, 2015; For U.S. Appl. No. 13/724,149; 14 pages.
Final Office Action dated Jan. 15, 2016; For U.S. Appl. No. 13/724,149; 21 pages.
Response dated Feb. 3, 2016 to European Office Action dated Jul. 24, 2015 with Amended Specification and Amended Claims; For European Pat. App. No. 13811286.7; 16 pages.
Response dated Feb. 3, 2016 to European Office Action dated Jul. 24, 2015 with Amended Specification and Amended Claims; For European Pat. App. No. 13815237.6; 8 pages.
Request for Continued Examination dated May 13, 2016; For U.S. Appl. No. 13/724,149; 3 pages.
Response dated May 13, 2016 to Final Office Action dated Jan. 15, 2016; For U.S. Appl. No. 13/724,149; 11 pages.
Office Action dated Jul. 3, 2015; for U.S. Appl. No. 13/727,080; 43 pages.
Response filed on Oct. 30, 2015 to Non-Final Office Action dated Aug. 3, 2015; for U.S. Appl. No. 13/724,080; 15 pages.
Final Office Action dated Feb. 5, 2016 corresponding to U.S. Appl. No. 13/724,080; 39 Pages.
Response with RCE filed on Apr. 27, 2016 to the Final Office Action dated Feb. 5, 2016; for U.S. Appl. No. 13/724,080; 17 pages.
Notice of Allowance dated May 17, 2016; for U.S. Appl. No. 13/724,080; 10 pages.

(56) References Cited

OTHER PUBLICATIONS

Non-Final Office action dated Jun. 16, 2016; for U.S. Appl. No. 13/724,149; 19 pages.
312 Amendment filed on Jun. 16, 2016; for U.S. Appl. No. 13/724,080; 9 pages.
RCE filed on Jun. 17, 2016; for U.S. Appl. No. 13/724,080; 3 pages.
U.S. Appl. No. 15/012,125, filed Feb. 1, 2016, Alpago, et al.
U.S. Appl. No. 15/012,131, filed Feb. 1, 2016, Alpago, et al.
U.S. Appl. No. 15/012,142, filed Feb. 1, 2016, Alpago, et al.
Banjevic; "High Bandwidth CMOS Magnetic Sensors Based on the Miniaturized Circular Vertical Hall Device;" Sep. 2011; 153 pages.
Drijaca, et al.; "Nonlinear Effects in Magnetic Angular Position Sensor With Integrated Flux Concentrator;" Proc. 23$^{rd}$ International Conference on Microelectronics (MIEL 2002); vol. 1; NIS; Yugoslavia; May 12-15, 2002; pp. 223-226; 4 pages.
Melexis MLX 90324; ""Under-the-Hood" Triaxis Rotary Position feat. SENT Protocol;" 3901090324 Data Sheet; Dec. 2008; 40 pages.
Petrie; "Circular Vertical Hall Magnetic Field Sensing Element and Method with a Plurality of Continuous Output Signals;" U.S. Appl. No. 13/035,243, filed Feb. 25, 2011; 56 pages.
Meher et al.: "50 Years of CORDIC: Algorithms, Architectures, and Applications", IEEE Transactions on Circuits and Systems; vol. 56, No. 9. Sep. 2009; p. 1893-1907 (15 pages).
Andraka, Ray: "A survey of CORDIC algorithms for FPGA based computers"; FPGA-1998, Montgomery, CA; (10 pages).
Allegro Microsystems, Inc.; "High Precision Linear Hall Effect Sensor IC with a Push/Pull, Pulse Width Modulated Output;" A1351; pp. 1-23; 23 pages.
Allegro Microsystems, Inc.; "High Precision 2-Wire Linear Hall Effect Sensor IC with a Pulse Width Modulated Output;" A1354; pp. 1-22; 22 pages.
Allegro Microsystems, Inc.; "High Precision Linear Hall-Effect Sensor with an Open Drain Pulse Width Modulated Output;" A1356; pp. 1-20; 20 pages.
Allegro Microsystems, Inc.; "Low-Noise Programmable Linear Hall Effect Sensor ICs with Adjustable Bandwidth (50 kHz Maximum) and Analog Output;" A1360, A1361, and A1362; pp. 1-25; 25 pages.
Baschirotto et al.; "Development and Analysis of a PCB Vector 2-D Magnetic Field Sensor System for Electronic Compasses;" IEEE Sensors Journal, vol. 6, No. 2; Apr. 2006; pp. 365-371; 7 pages.
Kejik, et al.; "Purley CMOS Angular Position Sensor Based on a New Hall Microchip;" 34$^{th}$ Annual Conference of IEEE Industrial Electronics; IECON; Nov. 10-13, 2008; pp. 1777-1781; 5 pages.
Kejik,.et al.; "Ultra Low-Power Angular Position Sensor for High-Speed Portable Applications;" 2009 IEEE Sensors Conference; Oct. 25-28, 2009; pp. 173-176; 4 pages.
Reymond, et al.; "True 2D CMOS Integrated Hall Sensor;" 2007 IEEE Sensors Conference; Oct. 28-31, 2007; pp. 860-863; 4 pages.
Gerhauser; "Intelligente 3D-Magnetfeld Snesorik;" Fraunhofer-Institut for Integrierte Schaltungen IIS; www.lis.fraunhofer.de/asic/analog; Oct. 2009; 2 pages.
Melexis Microelectronic Integrated Systems; MLX90333; "Triaxis 3D-Joystick Position Sensor;" Data Sheet; Mar. 2009; 43 pages.
MEMSIC Corporation; AN-00MM-004; "Electronic Tilt Compensation;" Mar. 2008; 5 pages.
MEMSIC Corporation; AN-00MM-003; "Magnetic Sensor Calibration;" Mar. 2008; 5 pages.
MEMSIC Corporation; AN-00MM-002; "Magnetometer Soldering Methodology;" Jun. 2008; 2 pages.
MEMSIC Corporation; AN-00MM-001; "Magnetometer Fundamentals;" Jun. 2008; 6 pages.
MEMSIC Corporation; AN-00MM-005; "Magnetic Sensor Placement Guidelines;" Oct. 2008; 2 pages.
MEMSIC Corporation; MMC312xMQ; "Tri-axis Magnetic Sensor, with I$^2$C Interface;" Aug. 14, 2008; 9 pages.
MEMSIC Corporation; MMC314xMS; "Ultra Small 3-axis Magnetic Sensor, with I$^2$C Interface;" Mar. 31, 2010; 8 pages.

Micronas GmbH; "HAL® 3625 Programmable Direct Angle Sensor;" Product Information; Sep. 2009; 2 pages.
Allegro Microsystems, Inc.; "A1140/41/42/43 Data Sheet: Sensitive Two-Wire Chopper-Stabilized Unipolar-Hall-Effect Switches;" published Sep. 9, 2004; pp. 1-11; 11 pages.
Allegro Microsystems, Inc.; "A1174 Data Sheet: Ultrasensitive Hall Effect Latch with Internally or Externally Controlled Sample and Sleep Periods for Track Ball and Scroll Wheel Applications;" published Jul. 25, 2008; pp. 1-13; 13 pages.
Allegro Microsystems, Inc.; "A1230 Data Sheet: Ultra-Sensitive Dual-Channel Quadrature Hall-Effect Bipolar Switch;" published Mar. 26, 2010; 16 sheets.
Allegro Microsystems, Inc.; "A1351 Data Sheet: High Precision Linear Hall Effect Sensor with a Push/Pull, Pulse Width Modulated Output;" published Mar. 7, 2008; pp. 1-23; 23 pages.
Allegro Microsystems, Inc.; "A1360, A1361 and A1362 Data Sheet: Low-Noise Programmable Linear Hall Effect Sensors with Adjustable Bandwidth (50 kHz Maximum) and Analog Output;" published Mar. 18, 2008; pp. 1-25; 25 pages.
Allegro Microsystems, Inc.; "A3212 Data Sheet: Micropower, Ultra-Sensitive Hall-Effect Switch;" published Sep. 22, 2004; pp. 1-12; 12 pages.
Allegro Microsystems, Inc.; "ATS675LSE Data Sheet: Self-Calibrating TPOS Speed Optimized for Automotive Cam Sensing Applications;" published Jul. 11, 2008; pp. 1-13; 13 pages.
Allegro Microsystems, Inc.; "27701-AN Data Sheet: Hall-Effect IC Applications Guide;" Application Information, Rev. 2; http://www.allegromicro.com/en/products/design/hall-effect-sensor-ic-applications-guide/AN27701.pdf; downloaded Sep. 29, 2010; pp. 1-40; 40 pages.
Allegro Microsystems, Inc.; "3235 Data Sheet 27633A, Dual-Output Hall-Effect Switch;" http://www.datasheetcatalog.org/datasheets/90/205047_DS.pdf; downloaded Sep. 29, 2010; 6 sheets.
Allegro Microsystems, Inc.; "A3425 Data Sheet: Dual, Chopper-Stabilized, Ultra-Sensitive Bipolar Hall-Effect Switch;" published Jun. 28, 2002; pp. 1-10; 10 pages.
Atherton et al.; "Sensor Signal Conditioning—an IC Designer's Perspective;" IEEE Electro International; Apr. 26-28, 1991; pp. 129-134; 6 pages.
Austria Microsystems; "AS5040 datasheet; 10-Bit Programmable Magnetic Rotary Encoder;" Revision 1.1; Jan. 2004; pp. 1-20; 20 pages.
Banjevic et al; "2D CMOS Integrated Magnetometer Based on the Miniaturized Circular Vertical Hall Device;" International Solid-State Sensors, Actuators and Microsystems Conference; Transducers; Jun. 21-25, 2009; pp. 877-880 ; 4 pages.
Blanchard et al.; "Cylindrical Hall Device;" International Electron Devices Meeting; Dec. 8-11, 1996; pp. 541-544; 4 pages.
Burger et al.; "New fully integrated 3-D silicon Hall sensor for precise angular-position measurements;" Sensors and Actuators, A 67; May 1998; pp. 72-76; 5 pages.
Dwyer; "Allegro Microsystems, Inc.; AN296061 Data Sheet: Ring Magnet Speed Sensing for Electronic Power Steering;" published Jul. 21, 2009; pp. 1-4.
Freitas et al.; "Giant magnetoresistive sensors for rotational speed control;" Journal of Applied Physics, vol. 85, No. 8; Apr. 15, 1999; pp. 5459-5461; 3 pages.
Gilbert; "Technical Advances in Hall-Effect Sensing;" Allegro Microsystems, Inc. Product Description; May 10, 2008; 7 sheets.
Häberli et al.; "Contactless Angle Measurements by CMOS Magnetic Sensor with On Chip Read-Out Circuit;" The 8$^{th}$ International Conference on Solid-State Sensors and Actuators and Eurosensors IX; Jan. 25-29, 1995; pp. 134-137; 4 pages.
Häberli et al.; "Two-Dimensional Magnetic Microsensor with On-Chip Signal Processing for Contactless Angle Measurement;" IEEE Journal of Solid-State Circuits, vol. 31, No. 12; Dec. 1996; pp. 1902-1907; 6 pages.
Hiligsmann et al.; "Monolithic 360 Degrees Rotary Position Sensor IC;" 2004 IEEE Proceedings of Sensors, vol. 3; Oct. 24-27, 2004; pp. 1137-1142; 6 pages.

(56) References Cited

OTHER PUBLICATIONS

Kejik et al.; "Circular Hall Transducer for Angular Position Sensing;" International Solid-State Sensors, Actuators and Microsystems Conference; Transducers; Jun. 2007; pp. 2593-2596; 4 pages.

Lou Law; "Angle Position Sensing with 2-Axis Hall ICs;" Sensors Magazine, vol. 20, No. 3; Mar. 2003; 7 sheets.

Masson et al.; "Multiturn and high precision through-shaft magnetic sensors;" Sensor + Text Conference; Proceedings II; May 2009; pp. 41-46; 6 pages.

Metz et al.; "Contactless Angle Measurement Using Four Hall Devices on Single Chip;"; International Conference on Solid State Sensors and Actuators; Transducers; vol. 1; Jun. 16-19, 1997; pp. 385-388; 4 pages.

Munter; "A Low-offset Spinning-current Hall Plate;" Sensors and Actuators, vol. A21-A23; Jan. 1990; pp. 743-746; 4 pages.

Novotechnik Siedle Group; "How New Angular Positioning Sensor Technology Opens a Broad Range of New Applications;" Vert-X Technology; Dec. 2001; pp. 1-5.

Paranjape et al.; "A CMOS-compatible 2-D vertical Hall magnetic-field sensor using active carrier confinement and post-process micromachining;" The $8^{th}$ International Conference on Solid-State Sensors and Acutators, Physical vol. 53, Issues 1-3; May 1996; pp. 278-283; 6 pages.

Petoussis et al.; "A Novel Hall Effect Sensor Using Elaborate Offset Cancellation Method;" Sensors & Transducers Journal vol. 100, Issue 1; Jan. 2009; pp. 85-91; 7 pages.

Popovic; "Not-plate-like Hall magnetic sensors and their applications;" Sensors and Actuators A; Physical, vol. 85, Issues 1-3; Aug. 2000; pp. 9-17; 9 pages.

Roumenin et al.; "Vertical Hall Effect Devices in the Basis of Smart Silicon Sensors;" IEEE Workshop on Intelligent Data Acquisition and Advanced Computing Systems: Technology and Applications; Sep. 5-7, 2005; pp. 55-58; 4 pages.

Roumenin; "Magnetic sensors continue to advance towards perfection;" Sensors and Actuators A: Physical, vol. 46-47, Issues 1-3; Jan.-Feb. 1995; pp. 273-279; 7 pages.

Schneider et al.; "Temperature Calibration of CMOS Magnetic Vector Probe for Contactless Angle Measurement System;" International Electron Devices Meeting; Dec. 8-11, 1996; pp. 533-536; 4 pages.

SENSIMA technology sa; "GVHD: a new concept of Angular Position Sensor;" Slide Presentation for Allegro Microsystems; Mar. 2009; 17 sheets.

Sentron; AN-101; "Angular position sensing with 2-Axis Hall IC 2SA-10;" Feb. 12, 2004; http://www.diegm.uniud.it/petrella/Azionamenti%20Elettrici%20II/Sensori%20e%20trasduttori/Data%20Sheet%20-%202SA-10.pdf; pp. 1-7.

van der Meer; et al; "CMOS quad spinning-current Hall-sensor system for compass application;" IEEE Proceedings of Sensors, vol. 3; Oct. 24-27, 2004; pp. 1434-1437; 4 pages.

Vogelgesang et al.; Robert Bosch GmbH; "GMR sensors in automotive application," CS-SNS/ECS Slides Presentation; Mar. 2, 2005; 16 sheets.

Volder; "The CORDIC Trigonometric Computing Technique," The Institute of Radio Engineers, Inc.; IRE Transactions on Electronic Computers, vol. EC, Issue 3; Sep. 1959; pp. 226-230; 5 pages.

Amendment and Response to Office Action dated Jun. 16, 2016 regarding U.S. Appl. No. 13/724,149; 10 pages.

\* cited by examiner

CIRCUITS AND METHODS FOR PROCESSING SIGNALS GENERATED BY A CIRCULAR VERTICAL HALL (CVH) SENSING ELEMENT IN THE PRESENCE OF A MULTI-POLE MAGNET

CROSS REFERENCE TO RELATED APPLICATIONS

This application is a continuation of, and claims the benefit under 35 U.S.C. §120 of the filing date of, co-pending U.S. patent application Ser. No. 13/724,080, filed on Dec. 21, 2012, the teachings of which are incorporated herein by reference in their entireties.

STATEMENT REGARDING FEDERALLY SPONSORED RESEARCH

Not Applicable.

FIELD OF THE INVENTION

This invention relates generally to electronic circuits, and, more particularly, to an electronic circuit having a vertical Hall (CVH) sensing element used in the presence of a multi-pole magnet, and that can provide an improved output signal with a higher angular (or positional) resolution while taking no additional time to provide the improved signal.

BACKGROUND OF THE INVENTION

Planar Hall elements and vertical Hall elements are known types of magnetic field sensing elements that can be used in magnetic field sensors. A planar Hall element tends to be responsive to magnetic field perpendicular to a surface of a substrate on which the planar Hall element is formed. A vertical Hall element tends to be responsive to magnetic field parallel to a surface of a substrate on which the vertical Hall element is formed.

Other types of magnetic field sensing elements are known. For example, a so-called "circular vertical Hall" (CVH) sensing element, which includes a plurality of vertical magnetic field sensing elements, is known and described in PCT Patent Application No. PCT/EP2008/056517, entitled "Magnetic Field Sensor for Measuring Direction of a Magnetic Field in a Plane," filed May 28, 2008, and published in the English language as PCT Publication No. WO 2008/145662, which application and publication thereof are incorporated by reference herein in their entirety. The CVH sensing element is a circular arrangement of vertical Hall elements arranged over a common circular implant region in a substrate. The CVH element can be used to sense a direction (and optionally a strength) of a magnetic field in a plans of the substrate.

Conventionally, all of the output signals from the plurality of vertical Hall elements within the CVH sensing element are needed in order to determine a direction of a magnetic field. Also conventionally, output signals from the vertical Hall elements of a CVH sensing element are generated sequentially, resulting in a substantial amount of time necessary to generate all of the output signals from the CVH sensing element. Thus, determination of the direction of the magnetic field can take a substantial amount of time.

Various parameters characterize the performance of magnetic field sensing elements. These parameters include sensitivity, which is a change in an output signal of a magnetic field sensing element in response to a change of magnetic field experienced by the magnetic sensing element, and linearity, which is a degree to which the output signal of the magnetic field sensing element varies in direct proportion to the magnetic field. These parameters also include an offset, which is characterized by an output signal from the magnetic field sensing element not representative of a zero magnetic field when the magnetic field sensing element experiences a zero magnetic field.

Another parameter that can characterize the performance of a CVH sensing element is the speed with which output signals from vertical Hall elements within the CVH sensing element can be sampled, and thus, the speed with which a direction of a magnetic field can be identified. Yet another parameter that can characterize the performance of a CVH sensing element is the resolution (e.g., angular step size) of the direction of the magnetic field that can be reported by the CVH sensing element.

As described above, the CVH sensing element is operable, with associated circuits, to provide an output signal representative of an angle of a direction of a magnetic field. Therefore, as described below, if a magnet is disposed upon or otherwise coupled is a so-called "target object," for example, a camshaft in an engine, the CVH sensing element can be used to provide as output signal representative of angle of rotation, and/or a rotation speed, of the target object.

For reasons described above, a magnetic field sensor that uses a CVH sensing element may have a limit as to how rapidly the magnetic field sensor can identify the direction of a magnetic field, i.e., a rotation angle or rotation speed of a target object. Furthermore, the magnetic field sensor may provide an angular resolution that is too low (too large an angle step size). In general, it may be possible to provide a higher resolution but at the expense of more time.

Thus, it would be desirable to provide a magnetic field sensor that uses a CVH sensing element (or, more generally, a plurality of magnetic field sensing elements) and that can provide an improved output signal with a higher angular (or positional) resolution while taking no additional time to provide the improved signal.

SUMMARY OF THE INVENTION

The present invention provides a magnetic field sensor that uses a CVH sensing element (or, more generally, a plurality of magnetic field sensing elements) and that can provide an improved output signal with a higher angular (or positional) resolution while taking no additional time to provide the improved signal.

In accordance with one aspect of the present invention, a magnetic field sensor includes a semiconductor substrate having a first surface in a coordinate plane. The magnetic field sensor also includes a Circular Vertical Hall (CVH) sensing element comprised of a plurality of vertical Hall elements. Each one of the plurality of vertical Hall elements is arranged upon a common circular implant region in the first surface of the semiconductor substrate. The plurality of vertical Hall elements is configured to generate a plurality of output signals responsive to a magnetic field having a direction component. The CVH sensing element is configured to generate a CVH output signal comprised of the plurality of output signals. The magnetic field results from a multi-pole magnet having a plurality of north poles and a plurality of south poles, each north pole proximate to at least one south pole. An angle sensor receives the CVH output signal and generates an angle signal representative of an angle of the direction component of the magnetic field as the multi-pole magnet and the CVH sensing element move relative to each other. A pole pair counter receives a signal representative of the angle signal and generates a count signal representative of a count of a number of the pole pairs of the multi-pole magnet that move past the CVH sensing element. An angle interpolation module receives the angle signal and the count signal and generates a reconstructed angle signal representative of an angular position of the multi-pole magnet relative to the CVH sensing element. The reconstructed angle signal is generated based upon the count signal and the angle signal, and has a higher resolution than the angle signal.

In accordance with another aspect of the present invention, a method of position sensing includes generating, with a Circular Vertical Hall (CVH) sensing element, a plurality of output signals responsive to a magnetic field having a direction component. The CVH sensing element is comprised of a plurality of vertical Hall elements disposed in a coordinate plane. The magnetic field results from a multi-pole magnet having a plurality of north poles and a plurality of south poles, each north pole proximate to at least one south pole. The method also includes generating a CVH output signal comprised of the plurality of output signals and generating an angle signal representative of an angle of the direction component of the magnetic field as the multi-pole magnet and the CVH sensing element move relative to each other. The method also includes generating a pole pair count signal representative of a count of a number of the pole pairs of the multi-pole magnet that moves past the CVH sensing element. The method also includes generating a reconstructed angle signal representative of an angular position of the multi-pole magnet relative to the CVH sensing element. The reconstructed angle signal is based upon the pole pair count signal and the angle signal, and has a higher resolution than the angle signal.

In accordance with another aspect of the invention, a magnetic field sensor includes a Circular Vertical Hall (CVH sensing element comprised of a plurality of vertical Hall elements. Each one of the plurality of vertical Hall elements is arranged upon a common circular implant region in the first surface of the semiconductor substrate. The plurality of vertical Hall elements is configured to generate a plurality of output signals responsive to a magnetic field having a direction component. The CVH sensing element is configured to generate a CVH output signal comprised of the plurality of output signals. The magnetic field sensor also includes a clock generator configured to generate a first clock signal and a second clock signal. The magnetic field sensor also includes an angle sensing circuit coupled to receive the CVH output signal and configured to generate an angle signal representative of an angle of the direction component of the magnetic field. The angle sensing circuit includes a multiplexer coupled to receive the CVH output signal at a first input and coupled to receive the first clock signal at a second input. The multiplexer is configured to generate a first multiplexed output signal comprised of the CVH output signal at some times and comprised of the first clock signal at other times. The angle sensing circuit further includes a comparator coupled to receive a signal representative of the first multiplexed output signal and configured to generate a comparison signal. The comparison signal has state transitions representative of zero crossings of the CVH output signal at some times and state transitions representative of state transitions of the first clock signal at other times. The angle sensing circuit further includes a counter coupled to receive the comparison signal, coupled to receive a signal representative of the first clock signal, and coupled to receive a signal representative of the second clock signal.

The counter is configured to generate a second multiplexed output signal comprised of a first count signal at some times and comprised of a second count signal at other times. The angle sensing circuit further includes a combining module coupled to receive a signal representative of the second multiplexed output signal and configured to generate the angle signal as a difference between the first count signal and the second count signal. A pole pair counting module receives the angle signal and generates a pole pair count signal representative of a count of a number of the pole pairs of the multi-pole magnet that move past the CVH sensing element. An angle interpolation module receives the angle signal and the pole pair count signal, and generates a reconstructed angle signal representative of an angular position of the multi-pole magnet relative to the CVH sensing element. The reconstructed angle signal is generated based upon the pole pair count signal and the angle signal, and has a higher resolution than the angle signal.

In accordance with another aspect of the invention, a method of position sensing includes generating, with a Circular Vertical Hall (CVH) sensing element, a plurality of output signals responsive to a magnetic field having a direction component. The CVH sensing element is configured to generate a CVH output signal comprised of the plurality of output signals. The method also includes generating a first clock signal and a second clock signal. The method also includes generating an angle signal representative of an angle of the direction component of the magnetic field. The generating the angle signal includes generating a first multiplexed output signal comprised of the CVH output signal at some times and comprised of the first clock signal at other times. The generating the x-y angle signal further includes generating a comparison signal from the first multiplexed output signal. The comparison signal has state transitions representative of zero crossings of the CVH output signal at some times and state transitions representative of state transitions of the first clock signal at other times. The generating the x-y angle signal further includes generating a second multiplexed output signal with a counter coupled to receive the comparison signal, coupled to receive a signal representative of the first clock signal, and coupled to receive a signal representative of the second clock signal. The second multiplexed output signal is comprised of a first count signal at some times and comprised of a second count signal at other times. The generating the x-y angle signal further includes generating the x-y angle signal as a difference between the first count signal and the second count signal. A pole pair count signal is generated that is representative of a count of a number of the pole pairs of the multi-pole magnet that moves past the CVH sensing element. A reconstructed angle signal is generated that is representative of an angular position of the multi-pole magnet relative to the CVH sensing element. The reconstructed angle signal is generated based upon the pole pair count signal and the angle signal and has a higher resolution than the angle signal.

With the above described magnetic field sensor and method, phase difference that would result from two circuit channels are avoided, resulting in a more accurate magnetic field sensor and method.

With the above described magnetic field sensor and method, phase difference that would result from two circuit channels are avoided, resulting in a more accurate magnetic field sensor and method.

BRIEF DESCRIPTION OF THE DRAWINGS

The foregoing features of the invention, as well as the invention itself may be more fully understood from the following detailed description of the drawings, in which.

DETAILED DESCRIPTION OF THE INVENTION

Before describing the present invention, some introductory concepts and terminology are explained. As used herein, the term "sensing element" is need to describe a variety of types of electronic elements that can sense a characteristic of the environment. For example, sensing elements include, but are not limited to, pressure sensing elements, temperature sensing elements, motion sensing elements, light sensing elements, acoustic sensing elements, and magnetic field sensing elements.

As used herein, the term "sensor" is used to describe a circuit or assembly that includes a sensing element and other components. In particular, as used herein, the term "magnetic field sensor" is used to describe a circuit or assembly that includes a magnetic field sensing element and electronics coupled to the magnetic field sensing element.

As used herein, the term "magnetic field sensing element" is used to describe a variety of electronic elements that can sense a magnetic field. The magnetic field sensing elements can be, but are not limited to, Hall effect elements, magnetoresistance elements, or magnetotransistors. As is known, there are different types of Hall effect elements, for example, a planar Hall element, a vertical Hall element, and a circular Hall element. As is also known, there are different types of magnetoresistance elements, for example, a giant magnetoresistance (GMR) element, an anisotropic magnetoresistance element (AMR), a tunnelling magnetoresistance (TMR) element, an Indium antimonide (InSb) sensor, and a magnetic tunnel junction (MTJ).

As is known, some of the above-described magnetic field sensing elements tend to have an axis of maximum sensitive parallel to a substrate that supports the magnetic field sensing element and others of the above-described magnetic field sensing elements tend to have an axis of maximum sensitivity perpendicular to a substrate that supports the magnetic field sensing element. In particular Hall elements tend to have axes of sensitivity perpendicular to a substrate, while magnetoresistance elements and vertical Hall elements (including circular vertical Hall (CVH) sensing elements) tend to have axes of sensitivity parallel to a substrate.

Magnetic field sensors are used in a variety of applications including, but not limited to, an angle sensor that senses an angle of a direction of a magnetic field, a current sensor that senses a magnetic field generated by a current carried by a current-carrying conductor, a magnetic switch that senses the proximity of a ferromagnetic object, a rotation detector that senses passing ferromagnetic articles, for example, magnetic domains of a ring magnet, and a magnetic field sensor that senses a magnetic field density of a magnetic field.

While a circular vertical Hall (CVH) magnetic field sensing element which has a plurality of vertical Hall magnetic field sensing elements, is described in examples below, it should be appreciated that the same or similar techniques and circuits apply to any type of sensing elements and to any type of sensors, i.e., to any type of measuring devices. In particular similar circuits and techniques apply to a plurality of separate vertical Hall elements, not arranged in a CVH structure.

Figure 1:
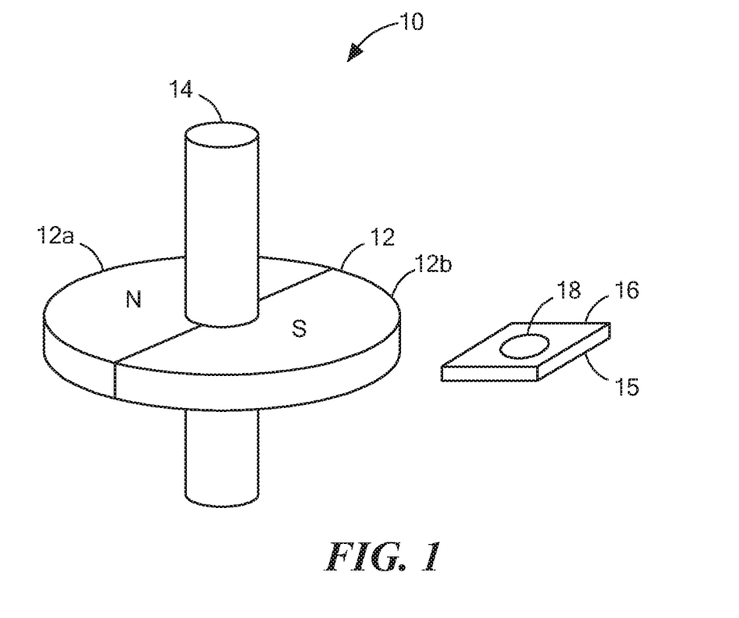
FIG. 1 is a pictorial showing a two-pole ring magnet coupled to a target object and proximate to a substrate upon which a circular vertical Hall (CVH) sensing element and associated electronic circuits are disposed.

Referring to FIG. 1, an exemplary position sensing arrangement 10 includes a two-pole ring magnet 12 having a north pole 12a and a south pole 12b. The ring magnet 12 is coupled to a shaft 14. The shaft 14 is a so-called "target object" for which it is desired to sense a rotation or a relational position.

A magnetic field sensor 15 includes a substrate 16 disposed proximate to the ring magnet 12 and to the side of, e.g., in the same plane as, the ring magnet 12.

A CVH sensing element and associated electronic circuit 18 are disposed upon the surface of the substrate 16. The substrate 16 together with the CVH sensing element and associated electronic circuit 18 form a magnetic field sensor 15 that can sense a position of the ring magnet 12. The magnetic field sensor 15 is described more fully below in conjunction with FIG. 3.

It will be understood that the CVH sensing element and associate electronic circuit 18 can provide an output signal representative of an angle of rotation of the ring magnet 12, and thus, an angle of rotation of the target object 14.

The magnetic field sensor 15 can generally provide an output signal representative of the angle of relation that has a range of values for every complete rotation through three hundred sixty degrees of the ring magnet 12 and the target object 14. It would be desirable to provide the output signal representative of the angle of rotation that has the same range of values or a similar range of values upon a rotation of the ring magnet 12 and the target object 14 through less then three hundred sixty degrees. Such an arrangement can provide a more precise representation of the angle of rotation.

Figure 2:
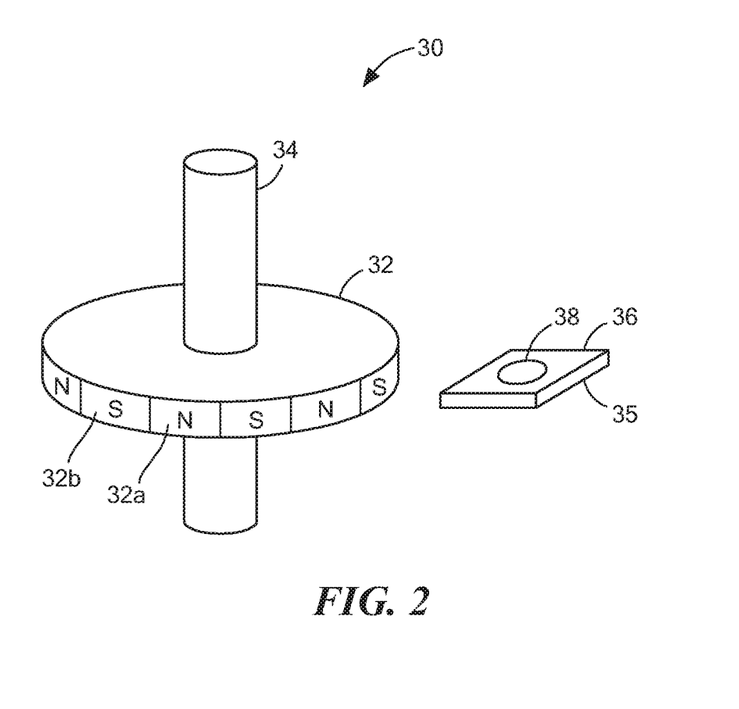
FIG. 2 is a pictorial showing a multi-pole ring magnet coupled to a target object and proximate to a substrate upon which a circular vertical Hall (CVH) sensing element and associated electronic circuits are disposed.

Referring now to FIG. 2, another exemplary position sensing arrangement 30 includes a multi-pole ring magnet 32 having a plurality of north poles and a plurality of south poles, of which a north pole 32a and a south pole 32b are representative. The multi-pole ring magnet 32 is coupled to a shaft 34, a target object 34. A substrate 36 is disposed proximate to the ring magnet 32 and to the side of, e.g., in the same plane as, the multi-pole ring magnet 32.

A magnetic field sensor 35 includes a substrate 36 disposed proximate to the ring magnet 32 and to the side of, e.g., in the same plane as, the ring magnet 32.

A CVH sensing element and associated electronic circuit 31 are disposed upon a surface of a substrate 36. The substrate 36 together with the CVH sensing element and associated electronic circuit 38 form a magnetic field sensor 35 that can sense a position of the ring magnet 32. The magnetic field sensor 35 is described more fully below in conjunction with FIG. 3.

It will be understood that the CVH sensing element and associated electronic circuit 38 can provide an output signal representative of an angle of rotation of the multi-pole ring magnet 32, and thus, an angle of rotation of the target object 34.

For reasons described more fully below, the magnetic field sensor 35 can generally provide an output signal having a range of values representative of the angle of rotation of the ring magnet 32 and the target object 34 through less than three hundred sixty degrees, compared to the magnetic field sensor 15 of FIG. 1. Thus, the magnetic field sensor 35 can provide a more precise representation of the angle of rotation.

Figure 3:
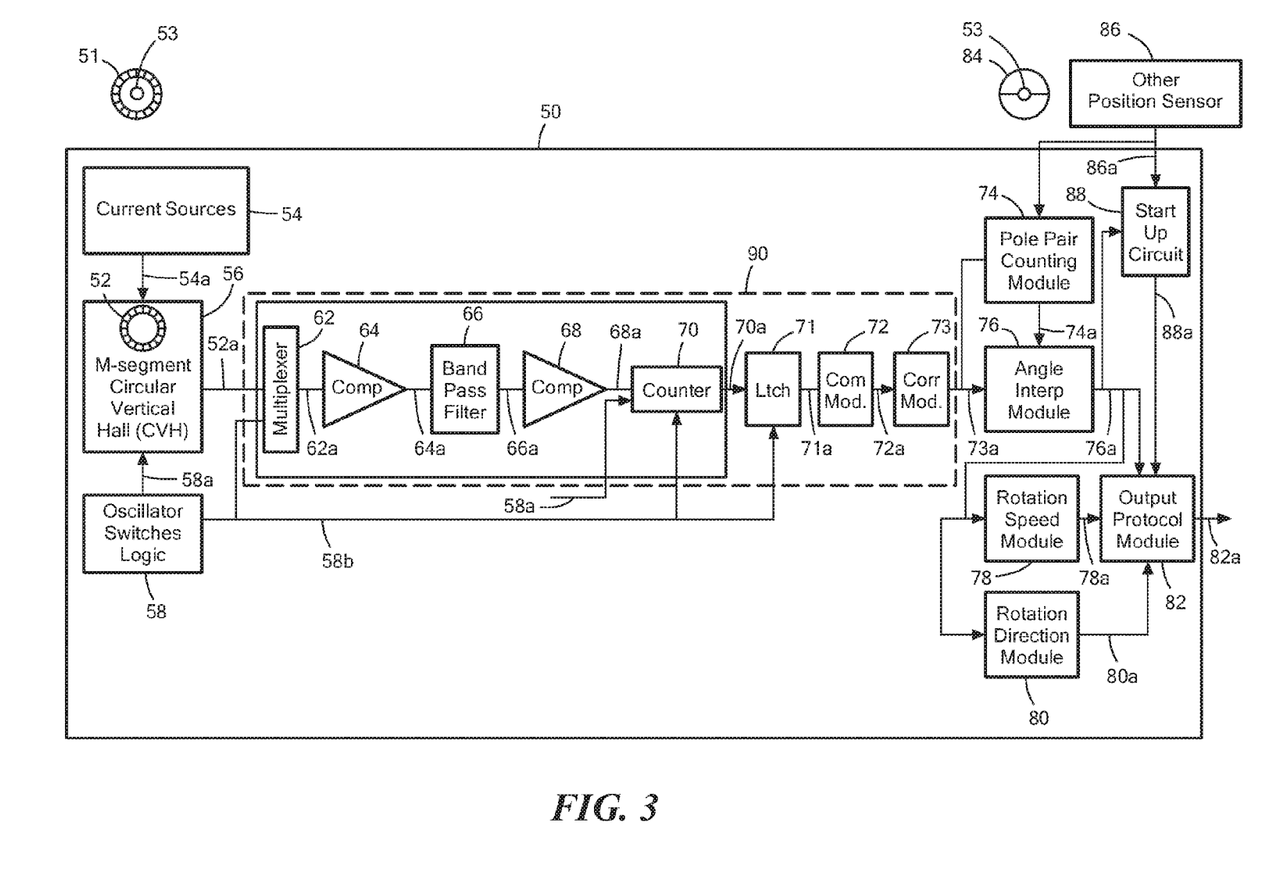
FIG. 3 is a block diagram of a CVH sensing element and an associated electronic circuit as may be used for the CVH sensing element and associate electronic circuit of FIG. 2.

Referring now to FIG. 3, a magnetic field sensor 50 is responsive to a multi-pole ring magnet 51 upon a target object 53. The multi-pole ring magnet 51 can be the same as or similar to the multi-pole ring magnet 32 of FIG. 2. The magnetic field sensor 50 can be the same as or similar to the magnetic field sensor 35 of FIG. 2 and can be disposed at the same relative position relative to the ring magnet 51.

The magnetic field sensor 50 includes a CVH sensing element 52 comprised of a plurality of vertical Hall elements. Each one of the plurality of vertical Hall elements is arranged upon a common circular implant region in a surface of a semiconductor substrate (not shown). The substrate can also have all of the magnetic field sensor 50 disposed thereon. The plurality of vertical Hall elements is configured to generate a respective plurality of x-y output signals responsive to a magnetic field having a time-varying direction component parallel to the x-y plane. In some embodiments, the magnetic field can have a time-varying direction in the x-y plane.

The CVH sensing element 52 is configured to generate a CVH output signal 52*a* comprised of the plurality of x-y output signals. The magnetic field results from the multi-pole magnet 51 having a plurality of north poles and a plurality of south poles, each disposed in a plane parallel to the x-y plane, each north pole proximate to at least one south pole. In some embodiments, the multi-pole magnet 51 is configured to rotate with a target object 53.

CVH sensing elements are known. CVH sensing element structure and function are described for example in PCT Patent Application No. PCT/EP2008/056517, guided "Magnetic Field Sensor for Measuring Direction of a Magnetic Field in a Plane," filed May 28, 2008, and published in the English language as PCT Publication No. WO 2008/145662, which application and publication thereof are incorporated by reference herein in their entirely.

Let it suffice here to say that the CVH sensing element 52 has a plurality of vertical Hall element contacts, for example, sixty-four contacts. Groups of the plurality of vertical Hall element contacts, for example, groups of five vertical Hall element contacts, are each representative of one vertical Hall element within the CVH sensing element. A vertical Hall element within the CVH sensing element 52 can share some vertical Hall element contacts, for example, four vertical Hall element contacts, with an adjacent vertical Hall element, i.e., adjacent vertical Hall elements can overlap by four contacts.

Chopping is a known technique by which, at some times, selected ones of the vertical Hall element contacts within a vertical Hall element can be driven by current sources 54 and a signal can be generated at other selected ones of the vertical Hall element contacts within the vertical Hall element. At other times, other selected ones of the vertical Hall element contacts within the vertical Hall element can be driven by the current sources 54 and another signal can be generated at still other selected ones of the vertical Hall element contacts within the vertical Hall element. For example, there can be four such chopped arrangements of a given vertical Hall element within a chopping cycle. Thereafter, another vertical Hall element can be selected and the four chopping arrangements can again be performed, and so on.

Chopping is an optional arrangement herein. Thus, the CVH output signal 52*a* can have samples that are chopped or samples that are not chopped.

The magnetic field sensor 50 can include a switching circuit 5*b* that provides the sequencing among vertical Hall elements within the CVH sensing element 52 either without chopping or with chopping. The switching circuit 56 can be controlled by an oscillator with switches logic 58 by way of a clock (control) signal 58*a*.

The current sources 54 can provide current signals 54*a* to drive the vertical Hall elements within the CVH sensing element 52 sequentially or in parallels and with or without chopping.

The oscillator and switches logic 58 can also generate a clock signal 58*b* that has a cycle frequency the same as a cycle frequency of the CVH output signal 52*a*. The cycle frequency of the CVH output signal 52*a* (and of the clock signal 58*b*) has a period corresponding to one sequential cycle of vertical Hall element samples around the CVH sensing element 52.

A circuit section 90 (also referred to herein as an angle sensing circuit 90) can include a multiplexer 62, which can be an analog multiplexer, which is coupled to receive the CVH output signal 52*a* and coupled to receive the clock signal 51*b*. It should be apparent that the CVH output signal 52*a* is an analog signal comprised of sequential analog samples, each sample from one of the vertical Hall elements within the CVH sensing element 52. It should also be apparent that the clock signal 58*b* is a two state digital signal. The multiplexer 62 is configured to generate an output signal 62*a* as a selected one of the CVH output signal 52*a* or the clock signal 58*b* at different respective times.

The angle sensing circuit 90 can also include a differential difference amplifier (DDA) coupled to receive the output signal 62*a* from the multiplexer 62 and configured to generate an amplified signal 64*a*.

The angle sensing circuit 90 can also include a bandpass filter 66 coupled to receive the amplified signal 64*a* and configured to generate a filtered signal 66*a*.

The angle sensing circuit 90 can also include a comparator 68 coupled to receive the filtered signal 66*a* and configured to generate a comparison signal 68*a*. The comparator 68 is also coupled to receive a threshold voltage (not shown).

The angle sensing circuit 90 can also include a counter 70 coupled to receive the comparison signal 68*a*, for example, at an enable input, and configured to generate a count signal 70*a*.

The counter 70 is also coupled to receive a clock signal, for example the clock signal 58*b*, for example, at a reset input, and to receive a higher frequency clock signal, for example, the clock signal 58*a*, at a clock input.

The angle sensing circuit 90 can also include a latch 71 to coupled to receive the count signal 70*a* and configured to generate a latched signal 71*a*.

The angle sensing circuit 90 can also include a combining module 72 coupled to receive the latched signal 71*a*.

The latch 71 is also coupled to receive the clock signal 58*b* at a latch input. More particularly, the clock signal 58*b* received by the latch 71 is slightly delayed from the clock signal 58*b* received by the counter 70.

In operation, the angle sensing circuit 90 separately processes, at different times, the CVH sensing element signal 52a and the clock signal 58b. Thus, at some times, the CVH output signal 52a is amplified by the DDA 64, filtered by the bandpass filter 66, compared by the comparator 68, counted by the counter 70, and latched by the latch 71 to achieve a first count value. At other times, the clock signal 51b is amplified by the DDA 64, filtered by the bandpass filter 66, compared by the comparator 68, counted by the counter 70, and latched by the latch 71 to achieve a second count value.

In this way, at some times, i.e., in some signal portions, the latched signal 71a is representative of a first phase difference taken between the CVH output signal 52a (after experiencing a phase shift passing though the circuit portion 90) and the clock signal 58b as received by the counter 70. At other times, i.e., in other signal portions, the latched signal 71a is representative of a second phase difference taken between the clock signal 58b (after experiencing a phase shift passing though the circuit portion 90) and the clock signal 58b as received by the counter.

The comparison module 72 is configured to generate a difference between the first and second phase differences to generate a so-called "x-y angle signal" 72a, which is representative of a direction of a magnetic field experienced by the CVH sensing element 52 in a plane (i.e., an x-y plane) of the CVH sensing element 52. In general, the plane of the CVH sensing element 52 is a major surface of the substrate on which the CVH sensing element 52 is disposed.

By using a common circuit channel, the angle sensing circuit 90 eliminates phase differences between processing channels that would be present using two separate channels, one for the CVH sensing element signals 52a and another for the clock signal 58b. The phase differences would translate directly into an angle error in the magnetic field sensor 50, i.e., in the x-y angle signal 72a. Thus, it will be understood that a difference between the first and second phase differences is representative of a phase difference between the CVH output signal 52a and the clock signal 58b, without phase errors introduced by the angle sensing circuit 90.

Referring again briefly to FIG. 1, it will be understood that, with the ring magnet 12, the direction of the magnetic field experienced by the CVH sensing element and associated electronics 18 rotates through three hundred sixty degrees with every three hundred sixty degree revolution of the ring magnet 12 and of the target object 14.

Referring again briefly to FIG. 2, it will be understood that, with the multi-pole ring magnet 32, the direction of the magnetic field experienced by the CVH sensing element and associated electronics 38 rotates several times through three hundred sixty degrees with every one of the three hundred sixty degree revolutions of the multi-pole ring magnet 32 and of the target object 34.

Referring again to FIG. 3, the magnetic field sensor 50 can include a correction module 73 coupled to receive the x-y angle signal 72a and configured to generate a corrected x-y angle signal 73a. The correction applied by the correction module 73 can be, for example, a certain number of degrees, representative of for example, an error in the mounting angle of the magnetic field sensor 50 relative to the target object.

In some embodiments, one or more correction values can be supplied to the correction module 73, for example, by a uses. The one or more correction values can be stored within the correction module 73. In some embodiments, the correction module includes a non-volatile memory (not shown) to store the one or more correction values. Thus, a user can correct (e.g., rotate an indicated angle of) the x-y angle signal 72a to provide a corrected x-y angle signal 73a, corrected in accordance with a mounting angle of the magnetic field sensor 50 relative to a zero angle reference position of the ring magnet 51. It should be appreciated that the applied correction can be small, e.g., one degree, or can be large, e.g., forty-five degrees.

In some other embodiments, there is no correction module 73.

The magnetic field sensor 50 can also include a pole pair counting module 74 coupled to receive the corrected x-y angle signal 73a (or the x-y angle signal 72a) and configured to generate a pole pair count signal 74a corresponding to a count of the number of pole pairs of the ring magnet 51 that pass by the CVH sensing element 52. The pole pair counting module 74 can be configured to count up to some maximum value, for example, four, then reset to zero and start counting again. In some embodiments, the pole pair counting module 74 is also coupled to receive another position signal 86a described more fully below.

The magnetic field sensor 50 can also include an angle interpolation module 76 coupled to receive the corrected x-y angle signal 73a and coupled to receive the pole pair count signal 74a. Using the two received signals, the angle interpolation module 76 is configured to generate a position signal 76a representative of a position, i.e., an angular position, of a target object, for example, the target object 53. However, the magnetic field experienced by the CVH sensing element 52 goes through several revolutions for each one of the revolutions of the target object 34. The pole pair count signal 74a is used by the angle interpolation module 76 to identify which one of the revolutions of the magnetic field experienced by the CVH sensing element is applicable.

The magnetic field sensor 50 can also include an output protocol module 82 coupled to receive the position signal 76a and configured to generate an output signal 82a in one of a variety of standard formats. For example, the output signal 82a can be in a SENT format, a VDA format, a pulse width modulate (PWM) format, an I2C format, or serial or parallel format.

The magnetic field sensor 50 can also include a rotation speed module 78 coupled to receive the position signal 76a and configured to generate a rotation speed signal 78a representative of a rotation speed of the target object 53.

The magnetic field sensor 50 can also include a rotation direction module 80 coupled to receive the position signal 76a and configured to generate a rotation direction signal 80a representative of a direction of rotation of the target object 53.

The output protocol module 82 can also be coupled to receive the rotation speed signal 78a and/or the rotation direction signal 80a. The output protocol module 82 can be configured to combine one or both of the rotation speed signal 78a or the rotation direction signal 80a with the position signal 76a, all within the output signal 82a.

The magnetic field sensor can also include a startup circuit 88 coupled to receive the position signal 76a. The startup circuit can also be configured to receive another position signal 86a from another position sensor 86. The other position sensor can be responsive to a ring magnet 84, e.g., a two-pole ring magnet 84, disposed on the same target object 53, shown here separately for clarity. The ring magnet 84 can be the same as or similar to the ring magnet 12 of FIG. 1.

The other position sensor 86 can be any type of position sensor. In some embodiments, the other position sensor 86 is like the magnetic field sensor 50, but without one or more of the modules 73, 74, 76, 78, 80, 82. Thus, the other position sensor 86 can be configured to generate the other position signal 86a to be like the x-y angle signal 72a.

In some embodiments, the ring magnet 84 and the ring magnet 51 are joined, for example, axially aligned and joined upon the same target object 53. In some embodiments, the other position sensor 86 can include another CVH sensing element like the CVH sensing element 52, and can be fabricated upon the same substrate within the magnetic field sensor 50, along with other circuits like the circuits 54, 56, 58, and 90, with or without another correction module 73, all coupled to the other CVH sensing element. However, in other embodiments, the other position sensor is fabricated upon a different substrate and within a different integrated circuit package than the magnetic field sensor 50.

The startup circuit 88 is configured to generate a signal 81a as a selected one of the position signal 76a or the other position signal 86a. In operation, the startup up circuit 88 can provide the other position signal 86a as the signal 88a to be embedded in the output signal 82a for a time period beginning at startup of the magnetic field sensor 50 and the other position sensor 86 (or alternatively, a startup of rotation of the target object 53). Thereafter, the startup up circuit 88 can provide the position signal 76a as the signal 88a to be embedded in the output signal 82a. In embodiments that include the startup circuit 88, the signal 76a need not be coupled to the output protocol module 82.

It will be understood from discussion below in conjunction with FIGS. 4 and 5 that the position signal 86a can have a first resolution (number of digital bits) and the position signal 76a can have a second different resolution (number of digital bits) higher than the first resolution. Thus, in some embodiments, the magnetic field sensor 50 can provide the output signal 82a with the first lower resolution for a time period following startup of the magnetic field sensor 50, and can thereafter provide the output signal 82a with the second higher resolution.

In still other embodiments, the startup circuit 88 is not used and both the position signal 76a and the other position signal 86a are both received by the output protocol circuit 82 and both are always embedded within the output signal 82a. In these embodiments, the magnetic field sensor 50 can provide the output signal 82 with content having both resolutions at the same time.

The rotation speed module 78 and the rotation direction module 80 are not described further herein. Circuits and techniques that can achieve the rotation speed module 78 and the rotation direction module 80 are described in U.S. patent application Ser. No. 13/084,745, filed Apr. 12, 2011, and entitled "A Magnetic Field Sensor That Provides An Output Signal Representative Of An Angle Of Rotation And A Speed Of Rotation Of The Target Object," which application is incorporated by reference herein in its entirety, and which application is assigned to the assignee of the present invention. Other techniques to achieve the rotation speed module 78 and the rotation direction module 80 are possible.

Figure 4:
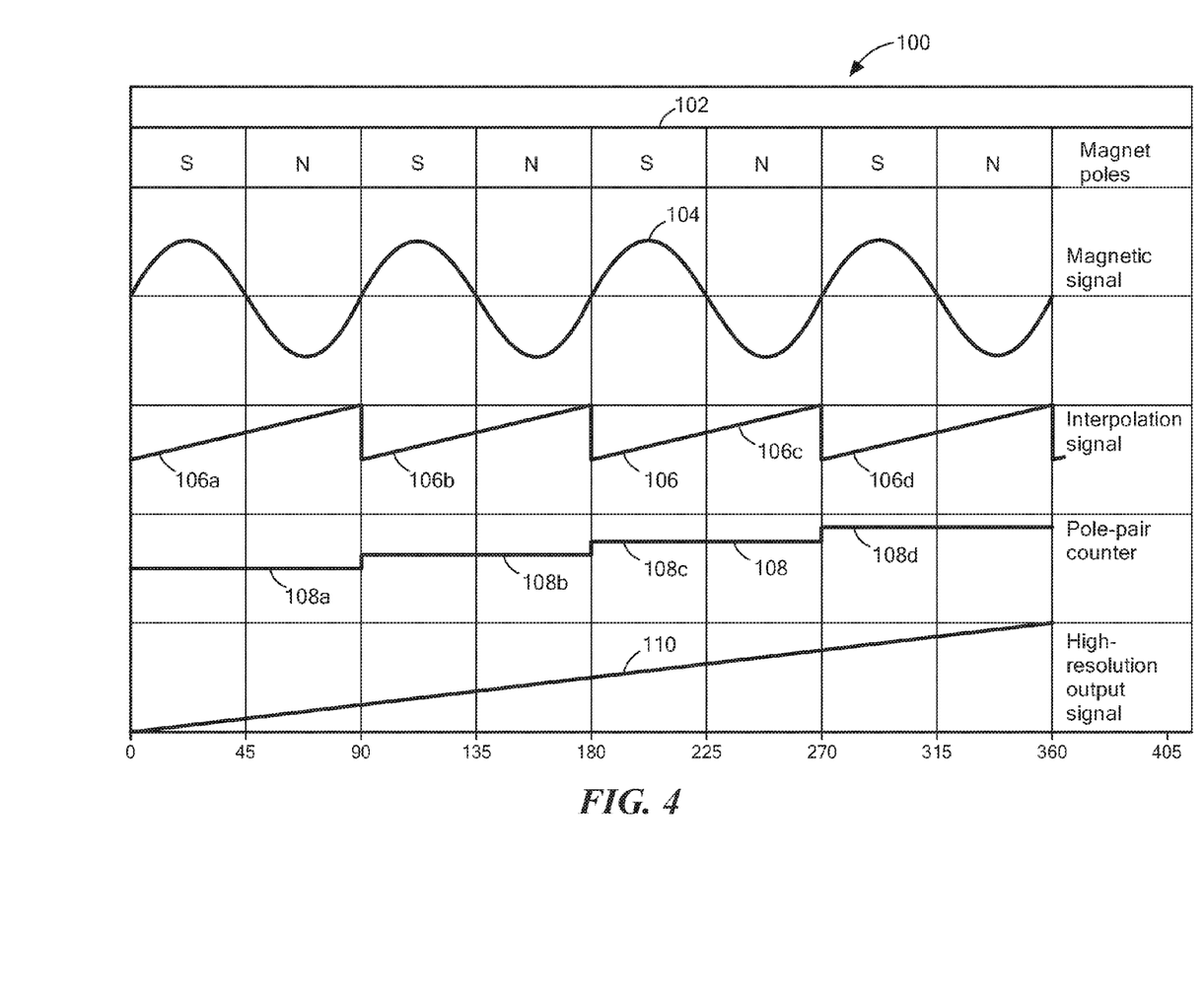
FIG. 4 is a graph showing a plurality of signals associated with the CVH sensing element and associate electronic circuits of FIG. 2.

Referring now to FIG. 4, a graph 100 includes a horizontal avis with a scale in units of a rotational angle of the target object 53 of FIG. 3. The graph 100 also includes a vertical axis with several scales in arbitrary units and identified by text to the right of the graph 100.

North and south poles 102 are representative of north and south poles of the multi-pole ring magnet 51 of FIG. 3 relative to angular position of the ring magnet 51, i.e., as they pass by the magnetic field sensor 50 of FIG. 3. It will be understood that all of the plurality of north and south poles rotate past the magnetic field sensor 50 of FIG. 3 upon one rotation through three hundred sixty degrees of the target object, e.g., 51 of FIG. 3. Thus, the magnetic field sensor 50 and the CVH sensing element 52 disposed thereon experience a magnetic field that rotates more rapidly than the target object 53.

A signal 104 is representative of a magnetic field experienced by the CVH sensing element 52 of FIG. 3 as the multi-pole ring magnet 53 represented by the north and south poles of FIG. 4 rotates through three hundred sixty degrees.

A signal 106 is representative of the x-y angle signal 72a of FIG. 3. As described above, the x-y angle signal 72a is a multi-bit digital signal. The signal 106 is an analog representation of the x-y angle signal 72a. It will be appreciated that the signal 106 can also be representative of the corrected x-y angle signal 73a of FIG. 3.

The signal 106 has a plurality of cycles 106a-106d corresponding to the plurality of cycles of the signal 104. The signal 106 is representative of the rotation angle, i.e., angular position, of the target object 53 of FIG. 3, however, with ambiguity. Each one of the cycles 106a-106d of the signal 106 can be representative of a full range of values indicative of zero to three hundred sixty degrees rotation of a sensed magnetic field.

The signal 106 can have a first number of digital bits indicative of a first angular resolution. It will be appreciated that the first angular resolution applies to a magnetic field rotation through three hundred sixty degrees, and thus, the first angular resolution is the same as that which would be achieved by the arrangement of FIG. 1, and also by the other position sensor 86 of FIG. 3 responsive to one pole pair of the ring magnet 84.

A signal 108 is representative of the pole pair count signal 74a of FIG. 3. As described above, the pole pair count signal 74a is a multi-bit digital signal. The signal 108 is an analog representation of the pole pair count signal 74a.

The signal 108 has a plurality of steps 108a-108d, i.e., changes of value, corresponding to counts of the plurality of cycles of the signal 104.

A signal 110 is representative of the position signal 76a of FIG. 3. As will be understood, the angle interpolation module 76 can identify which one of the pole pairs counted by the signal 108 is associated with which one of the cycles of the signal 106. Essentially, with this information, the angle interpolation module 76 can reconstruct the signal 106 into the signal 110, removing the angular position ambiguity of the signal 106.

The signal 110 can have a second number of digital bits, which can provide a higher resolution than the first resolution provided by the first number of bits of the signal 106. In the exemplary arrangement represented by the graph 100, in which the signal 106 has four cycles, the second resolution of the signal 110 can be four times the first resolution of the signal 106, i.e., the signal 110 can have two more digital bits thus the signal 106.

Figure 5:
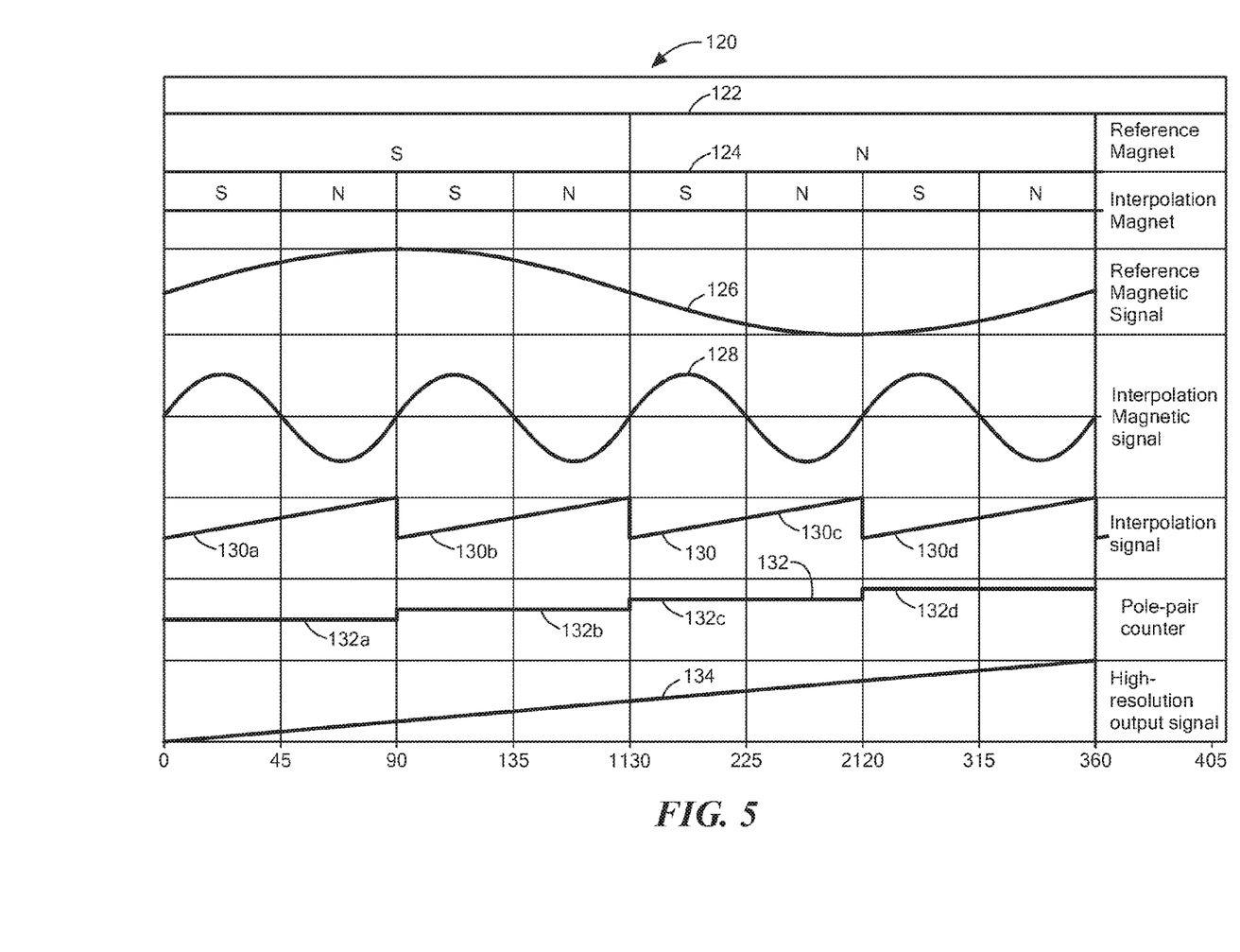
FIG. 5 is a graph showing a another plurality of signals associated with the CVH sensing element and associate electronic circuits of FIG. 2.

Referring now to FIG. 5, a graph 120 includes a horizontal rods with a scale in units of a rotational angle of the target object 34 of FIG. 2. The graph 120 also includes a vertical axis with several scales in arbitrary units and identified by text to the right of the graph 100.

North and south poles 124 are representative of north and south poles of the multi-pole ring magnet 51 of FIG. 3 relative to angular position of the ring magnet 32, i.e., as they pass by the CVH sensing element 52 of FIG. 3. It will be understood that all of the plurality of north and south poles rotate past the CVH sensing element 52 of FIG. 3 upon one rotation through three hundred and sixty degrees of the target object 53 of FIG. 3.

A north and south pole 122 are representative of the north and south poles of the two-pole ring magnet 84 of FIG. 3, to which the other position sensor 16 of FIG. 3 is responsive.

A signal 128 is comparable to the signal 104 of FIG. 4. A signal 130, having a plurality of cycles 130a-130d, is comparable to the signal 106 of FIG. 4. A signal 132, having a plurality of cycles 108a-108d, is comparable to the signal 108 of FIG. 4. A signal 134 is comparable to the signal 110 of FIG. 4.

A signal 126 is representative of a magnetic field experienced by the other magnetic field sensor 86 of FIG. 3, which is responsive to the north and south poles of the ring magnet 84, like the north and south poles 122.

The other magnetic field sensor 86 of FIG. 3 generates the other position signal 86a of FIG. 3 like one of the cycles of the signal 130 of FIG. 5, but extending in but one cycle from zero to three hundred sixty degrees rotation of the target object 53 of FIG. 3. This signal is not shown in the graph 120, but will be readily understood.

The signal 134 (i.e., the position signal 76a of FIG. 3) achieves the higher second resolution, higher than the resolution of the other position signal 86a.

Figure 6:
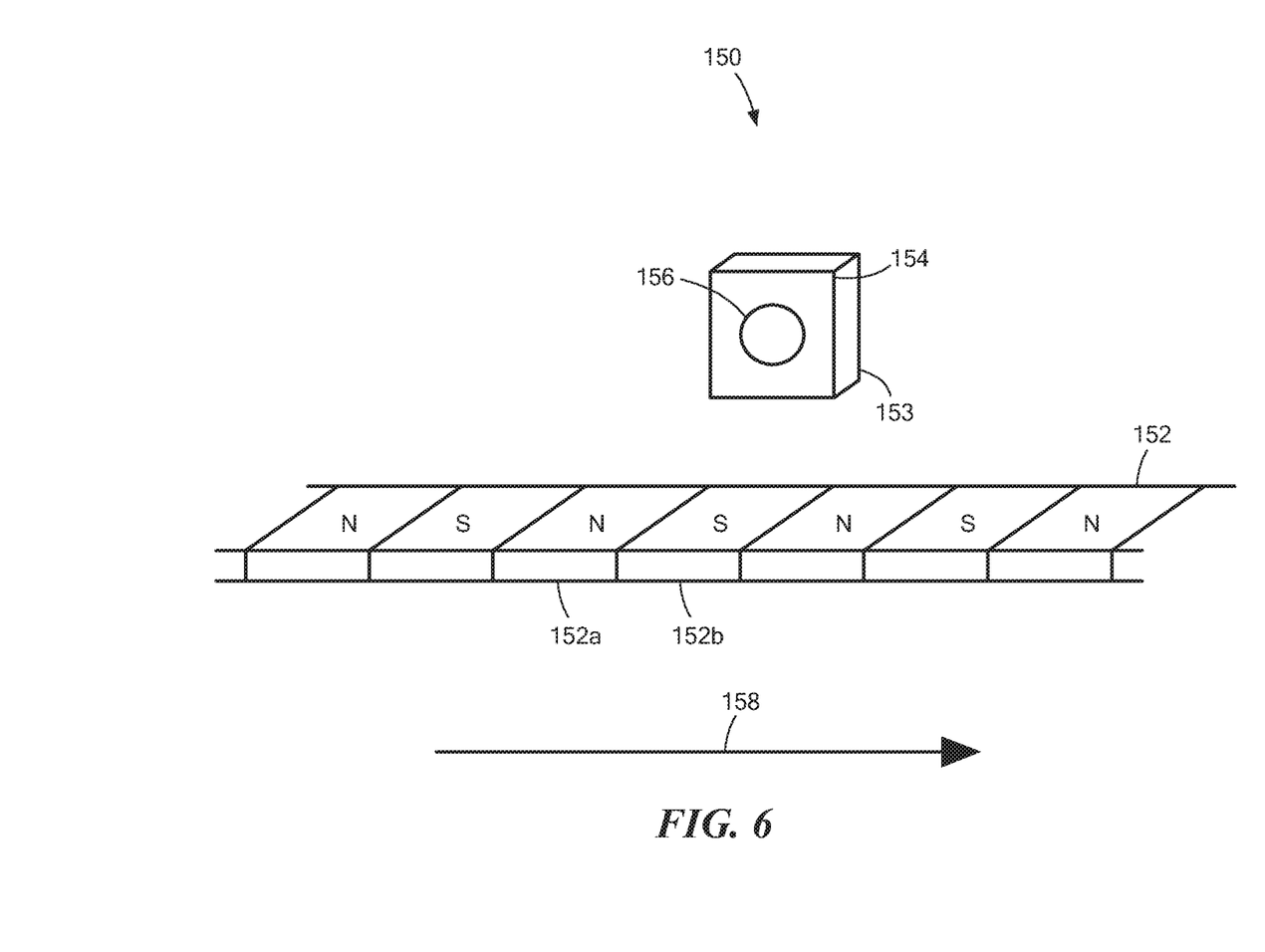
FIG. 6 is a pictorial showing a multi-pole line magnet proximate to a substrate upon which a circular vertical Hall (CVH) sensing element and associated electronic circuits are disposed.

Referring now to FIG. 6, another exemplary position sensing arrangement 150 includes a multi-pole line magnet 152 having a plurality of north and south poles, of which a north pole 152a and a south pole 152b are representative. The line magnet 152 is coupled to a target object (not shown) for which it is desired to sense a movement or a linear position.

The multi-pole line magnet 152 and the target object can be arranged to move in a direction 158, or in the opposite direction.

A magnetic field sensor 153 includes a substrate 154 disposed proximate to the multi-pole line magnet 152 in the same plane as magnetic field lines that exist between the north and south poles.

A CVH sensing element and associated electronic circuit 156 are disposed upon a surface of a substrate 154. The magnetic field sensor 153 can be the same as or similar to the magnetic field sensor 50 of FIG. 3.

It will be understood that the magnetic field sensor 153 can provide an output signal representative of a linear position of the multi-pole line magnet 152, and thus, a linear position of the target object (not shown) to which the multi-pole line magnet is coupled.

Operation of the magnetic field sensor will be understood from the discussion above in conjunction with FIGS. 3 and 4.

As with arrangements are described above, it should be appreciated that the magnetic field sensor 153 identifies the position of the target object (not shown) with a higher resolution than that provided by conventional techniques used with a CVH sensing element.

All references cited herein are hereby incorporated herein by reference in their entirety.

Having described preferred embodiments, which serve to illustrate various concepts, structures and techniques, which are the subject of this patient, it will now become apparent to those of ordinary skill in the art that other embodiments incorporating these concepts, structures and techniques may be used. Accordingly, it is submitted that that scope of the patent should not be limited to the described embodiments but rather should be limited only by the spirit and scope of the following claims.

What is claimed is:

1. A magnetic field sensor, comprising:
    a semiconductor substrate having a first surface in a coordinate plane;
    a Circular Vertical Hall (CVH) sensing element comprised of a plurality of vertical Hall elements, wherein each one of the plurality of vertical Hall elements is arranged upon a common circular implant region in the first surface of the semiconductor substrate, wherein the plurality of vertical Hall elements is configured to generate a plurality of output signals responsive to a magnetic field having a direction component, wherein the CVH sensing element is configured to generate a CVH output signal comprised of the plurality of output signals, wherein the magnetic field results from a multi-pole magnet disposed proximate to the magnetic field sensor and having a plurality of north poles and a plurality of south poles, each north pole proximate to at least one south pole;
    an angle sensing circuit coupled to receive the CVH output signal and configured to generate an angle signal representative of an angle of the direction component of the magnetic field as the multi-pole magnet and the CVH sensing element move relative to each other;
    a pole pair counting module coupled to receive a signal representative of the angle signal and configured to generate a count signal representative of a count of a number of the pole pairs of the multi-pole magnet that move past the CVH sensing element; and
    an angle interpolation module coupled to receive the angle signal and the count signal, the angle interpolation module configured to generate a reconstructed angle signal representative of an angular position of the multi-pole magnet relative to the CVH sensing element, the reconstructed angle signal generated based upon the count signal and the angle signal, the reconstructed angle signal having a higher resolution than the angle signal.

2. The magnetic field sensor of claim 1, wherein the multi-pole magnet comprises a multi-pole ring magnet, and wherein the plurality of north poles and a plurality of south poles are disposed in the coordinate plane.

3. The magnetic field sensor of claim 2, wherein the ring magnet is movably disposed to rotate about an axis perpendicular to the coordinate plane.

4. The magnetic field sensor of claim 1, wherein the multi-pole magnet comprises a multi-pole line magnet, and wherein the plurality of north poles and a plurality of south poles are disposed in the coordinate plane.

5. The magnetic field sensor of claim 4, wherein the line magnet is movably disposed to move along a line in the coordinate plane.

6. The magnetic field sensor of claim 4, wherein the CVH sensing element is movably disposed to move along a line in the coordinate plane.

7. The magnetic field sensor of claim 1, wherein the reconstructed angle signal removes an ambiguity from the angle signal of the angular position of the multi-pole magnet relative to the CVH sensing element.

8. The magnetic field sensor of claim 1, wherein the interpolated signal provides a first resolution of the position of the multi-pole magnet relative to the CVH sensing element, wherein the magnetic field sensor further comprises:
    a magnetic field sensing element configured to generate a magnetic field sensing element output signal responsive to a magnetic field generated by a second multi-pole magnet having at least one north pole and at least one south pole;

an electronic circuit coupled to receive the magnetic field sensing element output signal and configured to generate a position signal, wherein the position signal is representative of the position of the second multi-pole magnet relative to the magnetic field sensing element with a second different resolution; and an output protocol module coupled to receive the interpolated signal and the position signal, and configured to generate an output signal representative of the position signal at some times and configured to generate the output signal representative of the interpolated signal at other times.

9. A method of position sensing, comprising:

generating, with a Circular Vertical Hall (CVH) sensing element, a plurality of output signals responsive to a magnetic field having a direction component parallel to a coordinate plane, wherein the CVH sensing element is configured to generate a CVH output signal comprised of the plurality of output signals, wherein the magnetic field result from a multi-pole magnet having a plurality of north poles and a plurality of south poles, each north pole proximate to at least one south pole;

generating a CVH output signal comprised of the plurality of output signals;

generating an angle signal representative of an angle of the direction component of the magnetic field as the multi-pole magnet and the CVH sensing element move relative to each other;

generating a pole pair count signal representative of a count of a number of the pole pairs of the multi-pole magnet that moves past the CVH sensing element; and generating a reconstructed angle signal representative of an angular position of the multi-pole magnet relative to the CVH sensing element, the reconstructed angle signal generated based upon the pole pair count signal and the angle signal, the reconstructed angle signal having a higher resolution than the angle signal.

10. The method of claim 9, wherein the multi-pole magnet comprises a multi-pole ring magnet, and wherein the plurality of north poles and a plurality of south poles are disposed in the coordinate plane.

11. The method of claim 10, wherein the ring magnet is movably disposed to rotate about an axis perpendicular to the coordinate plane.

12. The method of claim 10, wherein the multi-pole magnet comprises a multi-pole line magnet, and wherein the plurality of north poles and a plurality of south poles are disposed in the coordinate plane.

13. The method of claim 12, wherein the line magnet is movably disposed to move along a line in the coordinate plane.

14. The method of claim 12, wherein the CVH sensing element is movably disposed to move along a line in the coordinate plane.

15. The method of claim 9, wherein generating the reconstructed angle signal comprises removing an ambiguity from the angle signal of the angular position of the multi-pole magnet relative to the CVH sensing element.

16. The method claim 9, wherein the interpolated signal provides a first resolution of the position of the multi-pole magnet relative to the CVH sensing element, wherein the method further comprises:

generating a magnetic field sensing element output signal responsive to a magnetic field generated by a second multi-pole magnet having at least one north pole and at least one south pole;

generating a position signal is representative of the position of the second multi-pole magnet relative to the magnetic field sensing element with a second different resolution; and generating an output signal representative of the position signal at some times and generating the output signal representative of the interpolated signal at other times.

17. A magnetic field sensor, comprising:

a Circular Vertical Hall (CVH) sensing element comprised of a plurality of vertical Hall elements, wherein each one of the plurality of vertical Hall elements is arranged upon a common circular implant region in a first surface of a semiconductor substrate, wherein the plurality of vertical Hall elements is configured to generate a plurality of output signals responsive to a magnetic field having a direction component, wherein the CVH sensing element is configured to generate a CVH output signal comprised of the plurality of output signals;

a clock generator configured to generate a first clock signal and a second clock signal;

an angle sensing circuit coupled to receive the CVH output signal and configured to generate an angle signal representative of an angle of the direction component of the magnetic field, wherein the angle sensing circuit comprises:

a multiplexer coupled to receive the CVH output signal at a first input and coupled to receive the first clock signal at a second input and configured to generate a first multiplexed output signal comprised of the CVH output signal at some times and comprised of the first clock signal at other times;

a comparator coupled to receive a signal representative of the first multiplexed output signal and configured to generate a comparison signal, wherein the comparison signal has state transitions representative of zero crossings of the CVH output signal at some times and state transitions representative of state transitions of the first clock signal at other times;

a counter coupled to receive the comparison signal, coupled to receive a signal representative of the first clock signal, and coupled to receive a signal representative of the second clock signal, wherein the counter is configured to generate a second multiplexed output signal comprised of a first count signal at some times and comprised of a second count signal at other times; and a combining module coupled to receive a signal representative of the second multiplexed output signal and configured to generate the angle signal as a difference between the first count signal and the second count signal;

a pole pair counting module coupled to receive the angle signal and configured to generate a pole pair count signal representative of a count of a number of the pole pairs of the multi-pole magnet that move past the CVH sensing element; and an angle interpolation module coupled to receive the angle signal and the pole pair count signal, the angle interpolation module configured to generate a reconstructed angle signal representative of an angular position of the multi-pole magnet relative to the CVH sensing element, the reconstructed angle signal generated based upon the pole pair count signal and the angle signal, the reconstructed angle signal having a higher resolution than the angle signal.

18. A method of position sensing, comprising:

generating, with a Circular Vertical Hall (CVH) sensing element, a plurality of output signals responsive to a magnetic field having a direction component, wherein the CVH sensing element is configured to generate a CVH output signal comprised of the plurality of output signals;

generating a first clock signal and a second clock signal; and generating an angle signal representative of an angle of the direction component of the magnetic field, wherein the generating the angle signal comprises:

generating a first multiplexed output signal comprised of the CVH output signal at some times and comprised of the first clock signal at other times;

generating a comparison signal from the first multiplexed output signal, wherein the comparison signal has state transitions representative of zero crossings of the CVH output signal at some times and state transitions representative of state transitions of the first clock signal at other times;

generating a second multiplexed output signal with a counter coupled to receive the comparison signal, coupled to receive a signal representative of the first clock signal, and coupled to receive a signal representative of the second clock signal, wherein the second multiplexed output signal is comprised of a first count signal at some times and comprised of a second count signal at other times; and generating the angle signal as a difference between the first count signal and the second count signal;

generating a pole pair count signal representative of a count of a number of the pole pairs of the multi-pole magnet that moves past the CVH sensing element; and generating a reconstructed angle signal representative of an angular position of the multi-pole magnet relative to the CVH sensing element, the reconstructed angle signal generated based upon the pole pair count signal and the angle signal, the reconstructed angle signal having a higher resolution than the angle signal.

* * * * *

UNITED STATES PATENT AND TRADEMARK OFFICE
CERTIFICATE OF CORRECTION

PATENT NO. : 9,541,424 B2  
APPLICATION NO. : 15/186433  
DATED : January 10, 2017  
INVENTOR(S) : Andreas P. Friedrich et al.

It is certified that error appears in the above-identified patent and that said Letters Patent is hereby corrected as shown below:

In the Specification

Column 2, Line 22 delete "coupled is a" and replace with --coupled to a--.

Column 3, Line 36 delete "(CVH" and replace with --(CVH)--.

Column 4, Line 20 delete "Circular Vertical" and replace with --circular vertical--.

Column 4, Line 55 delete "phase difference" and replace with --a phase difference--.

Column 4, Line 56 delete "are" and replace with --is--.

Column 5, Line 15 delete "showing a another" and replace with --showing another--.

Column 8, Line 11 delete "circuit 5b" and replace with --circuit 56--.

Column 11, Line 17 delete "startup up circuit" and replace with --startup circuit--.

Column 11, Line 22-23 delete "the startup up circuit" and replace with --the startup circuit--.

Column 13, Line 61 delete "patient" and replace with --patent--.

In the Claims

Column 14, Line 5 delete "Circular Vertical" and replace with --circular vertical--.

Column 15, Line 18 delete "Circular Vertical" and replace with --circular vertical--.

Column 16, Line 13 delete "Circular Vertical" and replace with --circular vertical--.

Signed and Sealed this  
Third Day of April, 2018

Andrei Iancu  
*Director of the United States Patent and Trademark Office*